(12) United States Patent
Lo

(10) Patent No.: US 11,036,627 B2
(45) Date of Patent: *Jun. 15, 2021

(54) SELF-MANAGEMENT MEMORY SYSTEM AND OPERATING METHOD THEREOF

(71) Applicant: SK hynix Inc., Gyeonggi-do (KR)

(72) Inventor: Yungcheng Lo, Cupertino, CA (US)

(73) Assignee: SK hynix Inc., Gyeonggi-do (KR)

( * ) Notice: Subject to any disclaimer, the term of this patent is extended or adjusted under 35 U.S.C. 154(b) by 15 days.

This patent is subject to a terminal disclaimer.

(21) Appl. No.: 16/557,307

(22) Filed: Aug. 30, 2019

(65) Prior Publication Data

US 2019/0384702 A1 Dec. 19, 2019

Related U.S. Application Data

(63) Continuation of application No. 15/595,636, filed on May 15, 2017, now Pat. No. 10,402,314.

(60) Provisional application No. 62/337,018, filed on May 16, 2016.

(51) Int. Cl.
*G11C 16/06* (2006.01)
*G06F 12/02* (2006.01)

(52) U.S. Cl.
CPC .......... *G06F 12/0246* (2013.01); *G11C 16/06* (2013.01); *G06F 2212/1016* (2013.01); *G06F 2212/7207* (2013.01)

(58) Field of Classification Search
CPC ......... G06F 12/0246; G06F 2212/7207; G06F 2212/1016; G11C 16/06
See application file for complete search history.

(56) References Cited

U.S. PATENT DOCUMENTS

| | | | |
|---|---|---|---|
| 2008/0094893 A1* | 4/2008 | Choi | G11C 11/5628 365/185.03 |
| 2013/0073895 A1* | 3/2013 | Cohen | G06F 11/1096 714/6.2 |
| 2013/0311710 A1* | 11/2013 | Yang | G11C 16/22 711/103 |
| 2015/0043277 A1* | 2/2015 | Fitzpatrick | G06F 3/064 365/185.11 |
| 2016/0210074 A1* | 7/2016 | Gerhart | G06F 3/0632 |

* cited by examiner

*Primary Examiner* — Mohammed A Bashar
(74) *Attorney, Agent, or Firm* — IP & T Group LLP

(57) ABSTRACT

A semiconductor memory system and an operating method thereof include a controller configured to perform macro management; and a memory device including Nand pages, counters, a self-management component, and devoted memories, wherein the memory device is coupled and controlled by the controller, the Nand pages contains data corresponding to commands received from the controller, the counters are configured to track operation information corresponding to the Nand pages in accordance with the commands, the devoted memories are configured to record recovery information, and the self-management component configured to perform micro management in accordance at least in part with the operation information or the recovery information.

20 Claims, 5 Drawing Sheets

SELF-MANAGEMENT MEMORY SYSTEM AND OPERATING METHOD THEREOF

CROSS-REFERENCES TO RELATED APPLICATIONS

This application is a continuation of U.S. patent application Ser. No. 15/595,636 filed on May 15, 2017, claims the benefit of U.S. Provisional Application No. 62/337,018 entitled SELF-MANAGEMENT DESIGN IN NAND filed May 16, 2016. The disclosure of each of the foregoing application is incorporated herein by reference in its entirety.

BACKGROUND

Field of Invention

Exemplary embodiments of the present invention relate to an apparatus of semiconductor memory storage system, and more particularly to self-management design in NAND and an operating method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include flash memory components and a SSD controller. The SSD controller can be also referred as a processor, which includes the electronics that bridge the flash memory components to the SSD input/output (I/O) interfaces. The SSD controller can include an embedded processor that can execute functional components, such as firmware. The SSD functional components are device specific, and in most cases, can be updated.

The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NOR-type flash allows a single machine word (byte) to be written to an erased location or read independently. The NAND-type operates primarily in memory cards, USB flash drives, solid-state drives, and similar products, for general storage and transfer of data.

Thus, there remains a need for a semiconductor memory system and operating method thereof for a self-management design NAND. In view of the ever-increasing need to improve performance and security, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

A semiconductor memory system comprises a controller configured to perform macro management; and a memory device including Nand pages, counters, a self-management component, and devoted memories, wherein the memory device is coupled and controlled by the controller, the Nand pages contains data corresponding to commands received from the controller, the counters are configured to track operation information corresponding to the Nand pages in accordance with the commands, the devoted memories are configured to record recovery information, and the self-management component configured to perform micro management in accordance at least in part with the operation information or the recovery information.

An operating method of a semiconductor memory system comprises performing macro management by a controller; tracking operation information corresponding to Nand pages in accordance with commands received from the controller by counters; recording recovery information by devoted memories; and performing micro management in accordance at least in part with the operation information or the recovery information by a self-management component.

DETAILED DESCRIPTION

Figure 1:
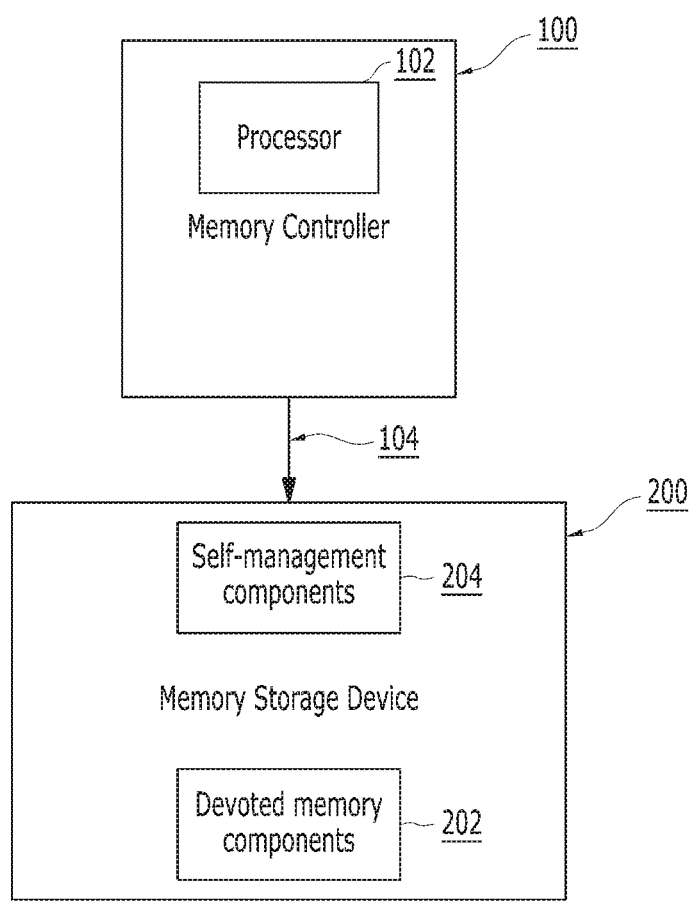
FIG. 1 is a top-level block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A memory system controller manages all tasks of the memory system, including upper level tasks with mega computation and lower level tasks of simple operations, such as bookkeeping process of memory components. However, some of the tasks performed by the memory controller can be released to the memory components, such as Nand, to handle. The tasks can be released to the memory components can include the lower level tasks of simple operations, wherein the simple operations typically involving substantial communication between the memory controller and the memory components. The major reasons are that the bandwidth between the memory controller and Nand is extremely expensive, and the memory spaces in the memory controller is expensive too.

By relocating the said simple operations typically involving substantial communication between the memory controller and the memory components from the memory controller to the memory components, some of memory information saved in the memory controller, such as drive information, can be saved in the memory components locally, to eliminate substantial communication required for constant updating. The said simple operations that Nand is capable to handle can be performed by Nand to relief the burden of the memory controller, such that the memory controller can focus on the more important upper level tasks. The bandwidth of the memory system and the memory spaces in the memory controller can be saved for the more important upper level tasks, resulting in an improvement of the memory system performance. Reduction of the communication between the memory controller and the memory components not only save the bandwidth of the memory system, but also improve the reliability since less error may occur due to less interaction. Thus, the self-management design in Nand can improve reliability and efficiency of the memory system, and further improve the performance of the memory system.

In the current technology, the memory controller manages all tasks from sending read/write/erase commands, monitoring age/health of the Nand, merging blocks for garbage collection, and recording the last operation before interrupts, such as power loss, etc. The main reason for the memory controller to take over every task is that the memory controller is equipped with comprehensive operational blocks. However, the memory controller has some limitations, such as limited storage and limited computing engines including CPUs and ECC engines. Some of the tasks, such as bookkeeping on Nand status, are simple and can be performed by Nand instead of the memory controller. Therefore, a smarter Nand or a smarter memory device with self-management is designed and provided in embodiments of the present invention.

A smarter and enhanced Nand can have some basic management abilities, such as keeping track of some Nand activities. The basic management abilities typically can perform the said simple operations discussed above. Instead of merely being a massive storage, Nand can incorporate functional components, such as counters, self-management components, and devoted memories/system area, necessary for implementing the said simple operations. The smarter and enhanced Nand, such as a self-management Nand, can reduce the interaction between the memory controller and Nand, such as constant updating process, and utilize the bandwidth of Nand and the memory controller more efficiently. The said simple operations mainly support the lower level tasks including power up/down procedure, maintaining memory components health, operational test procedure (OTP), etc.

A smarter and enhanced Nand can self-manage some information, such as numbers of Program/Erase (PE) cycles of blocks, addresses of the last written page in the blocks, extensive read on a particular page, or previous read information, etc. All of the information that is self-managed by Nand can be used to improve a rebuild process, wherein the rebuild process relies mainly on frequently updating from the memory controller to Nand. The rebuild process handled by Nand can be more accurate with more prompt updated information saved in Nand, and additional counters and extra memories can be introduced in Nand in some embodiments of the present invention. Optionally, a simple CPU-like processor or artificial intelligent (AI) can be embedded to Nand to unload the burden of the memory controller in other embodiments of the present invention. The memory controller can perform macro management on the Nand by requesting information from Nand, while Nand itself can conduct micromanagement to separate the tasks.

The problem of heavily loaded burden can be seen in the memory controller. Nand can become "lazy" merely as a passive storage device. Instead of being a massive storage device only, Nand can be upgraded and designed as a smarter device and perform some basic tasks, such as bookkeeping, and even make some simple decisions. Thus, some of the loads in the memory controller can be assigned to Nand, and unload the burden of the memory controller. Because the memory controller only updates with Nand periodically, Nand may have the most updated information that is not updated to the memory controller yet. The power up process performed by Nand can be more accurate than by the memory controller after sudden power loss, since Nand may have the most updated power up information. The memory controller may not need to request or search corresponding information from Nand to perform the power up process. The memory controller can be spared to conduct more intelligent upper level management operations and decisions, such as garbage collection, wear-leveling, and end of life (EOL) handling. Nand can have self-management ability to help the memory controller by managing Nand itself.

The self-management design Nand can contain some basic counters in each Nand page or block to keep tracking of read/write/erase operations. A portion of the memory pages can be devoted to record the drive/system information including the last written page address, for faster data recovery after power cycle or sudden power loss. The size and location of the devoted portion of the memory pages can be determined in accordance with the configuration of the memory system. In some memory system, the devoted memory can be referred as system area. The self-managed Nand can even make decisions and send the corresponding information to the memory controller on some issues, such as read disturb information. A simple CPU-like processor can be embedded into the self-management design Nand for a better performance.

Referring now to FIG. 1, therein is shown a top-level block diagram schematically illustrating a memory system in accordance with an embodiment of the present invention. The memory system 10 can include numerous components including a memory controller 100, and semiconductor memory devices 200, such as flash memory devices. The memory controller 100 can comprise a processor 102 for executing programs and instructions stored in the memory system for operating the memory system. The semiconductor memory devices 200 can comprise self-management components 204, and extra memories/devoted memory components 202.

The memory controller 100 may control overall operations of the semiconductor memory devices 200, via a communication input/output (I/O) bus 104 comprises command CMD, address ADDR, data, power PWR, and a control signal CTRL. The control signal CTRL may include a command latch enable (CLE) signal, an address latch enable (ALE) signal, a chip enable (CE) signal, a write enable (WE) signal, a read enable (RE) signal, and so on.

The semiconductor memory devices 200 may perform one or more erase, program, write, and read operations under the control of the memory controller 100. The semiconductor memory devices 200 may receive the command, address, and data through input/output lines from the memory controller 100. The semiconductor memory devices 200 may receive the power PWR through a power line and the control signal CTRL through a control line.

The memory controller 100 and the semiconductor memory devices 200 may be integrated in a single semiconductor device such as the SSD or a memory card. For example, the memory controller 100 and the semiconductor memory devices 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
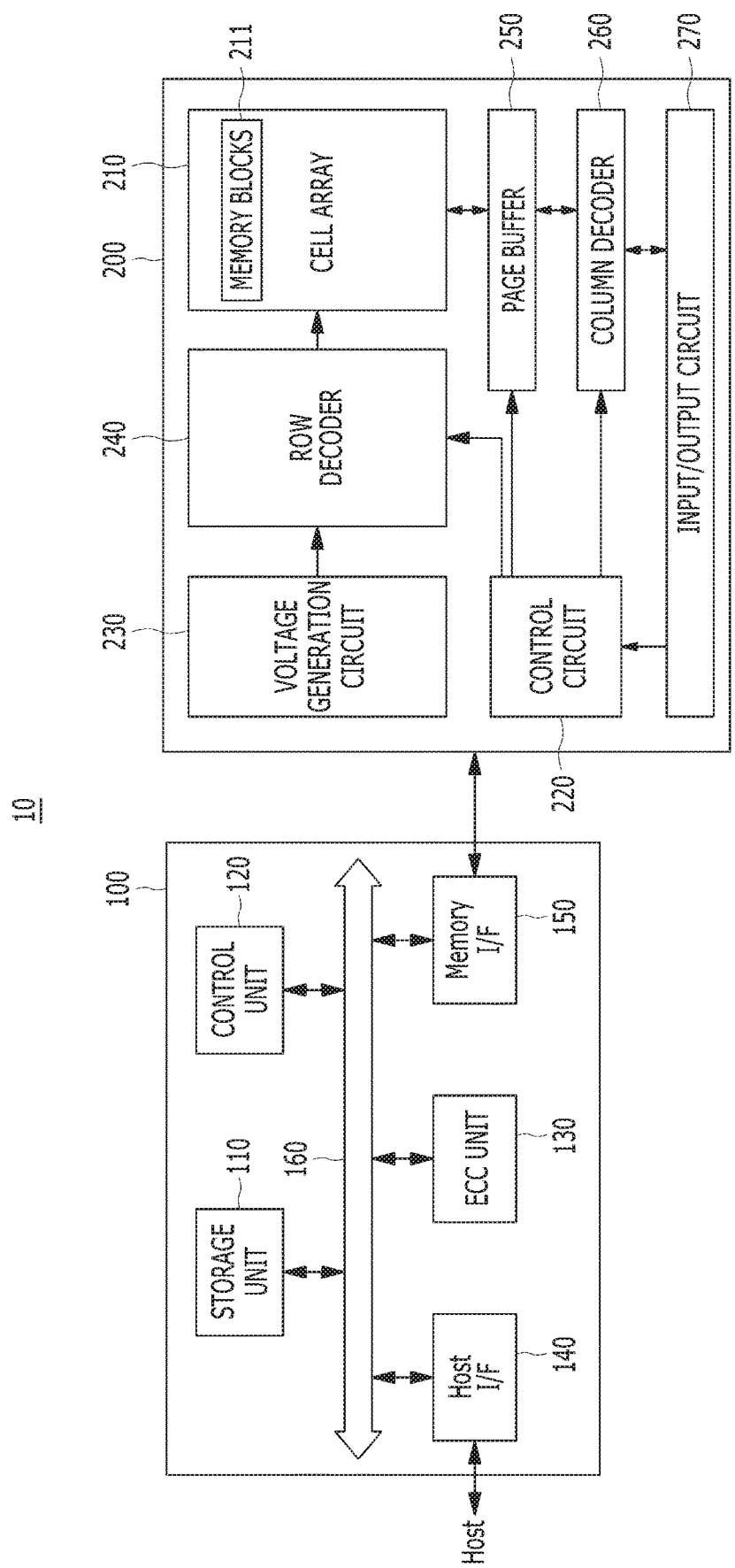
FIG. 2 is a detailed block diagram illustrating a semiconductor memory system in accordance with an embodiment of the present invention.

Referring now to FIG. 2, therein is shown a detailed block diagram illustrating a memory system in accordance with an embodiment of the present invention. For example, the memory system of FIG. 2 may depict the memory system shown in FIG. 1. The memory system 10 may include the memory controller 100 and the semiconductor memory devices 200. The memory system may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The semiconductor memory devices 200 may store data to be accessed by the host device.

The semiconductor memory devices 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory controller 100 may control storage of data in the semiconductor memory devices 200. For example, the memory controller 100 may control the semiconductor memory devices 200 in response to a request from the host device. The memory controller 100 may provide the data read from the semiconductor memory devices 200, to the host device, and store the data provided from the host device into the semiconductor memory devices 200.

The memory controller 100 may include a storage unit 110, a control unit 120, the error correction code (ECC) unit 130, a host interface 140 and a memory interface 150, which are coupled through a bus 160.

The storage unit 110 may serve as a working memory of the memory system and the memory controller 100, and store data for driving the memory system and the memory controller 100. When the memory controller 100 controls operations of the semiconductor memory devices 200, the storage unit 110 may store data used by the memory controller 100 and the semiconductor memory devices 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the semiconductor memory devices 200 for the read and write operations. To store the data, the storage unit 110 may include a program memory, a data memory, a write buffer, a read buffer, a map buffer, and so forth.

The control unit 120 may control general operations of the memory system, and a write operation or a read operation for the semiconductor memory devices 200, in response to a write request or a read request from the host device. The control unit 120 may drive firmware, which is referred to as a flash translation layer (FTL), to control the general operations of the memory system. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the semiconductor memory devices 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the semiconductor memory devices 200 to allow the memory controller 100 to control the semiconductor memory devices 200 in response to a request from the host device. The memory interface 150 may generate control signals for the semiconductor memory devices 200 and process data under the control of the CPU 120. When the semiconductor memory devices 200 is a flash memory such as a NAND flash memory, the memory interface 150 may generate control signals for the memory and process data under the control of the CPU 120.

The semiconductor memory devices 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may pre-charge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
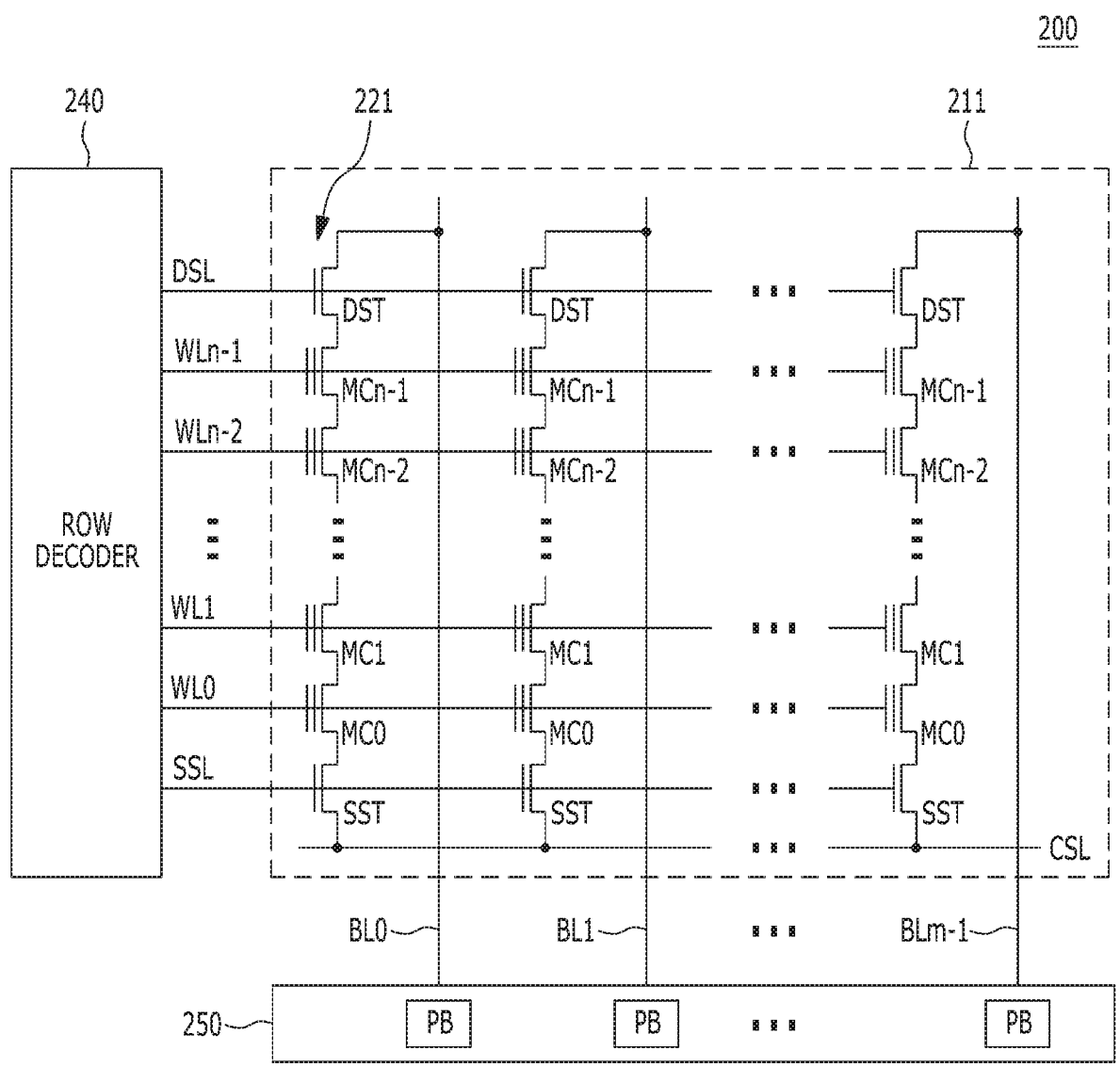
FIG. 3 is a circuit diagram illustrating a memory block of semiconductor memory devices in accordance with an embodiment of the present invention.

Referring now to FIG. 3, herein is shown a circuit diagram illustrating a memory block of semiconductor memory devices 200 in accordance with an embodiment of the present invention. For example, a memory block of FIG. 3 may be the memory blocks 211 of the memory cell array of the semiconductor memory devices 200 shown in FIG. 2.

The memory blocks 211 may include a plurality of cell strings 221 coupled to bit lines BL0 to BLm−1, respectively. The cell string of each column may include one or more drain selection transistors (DST) and one or more source selection transistors (SST). A plurality of memory cells or memory cell transistors may be serially coupled between the DSTs and SSTs. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
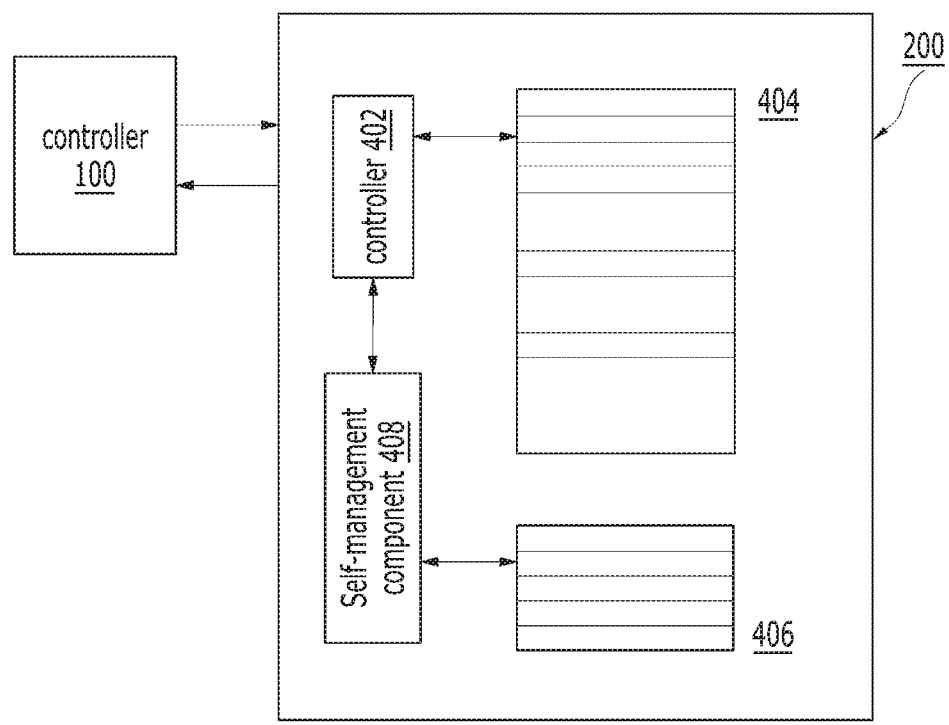
FIG. 4 is a block diagram schematically illustrating a self-management memory system in accordance with an embodiment of the present invention.

FIG. 4 is a block diagram schematically illustrating a self-management memory system in accordance with an embodiment of the present invention. The memory system can comprise a controller 100 and a memory device 200, of FIG. 1. The memory device 200, such as Nand, can include counters 402, memory pages, such as Nand pages 404, extra memories/devoted memory components 202 of FIG. 1, such as devoted memories 406, and self-management components 204 of FIG. 1, such as a self-management component 408.

As described above, the controller 100 and the memory device 200 can communicated via data path and command path for transferring controller signals and data for conducting a plurality of memory operations. The controller 100 can send a plurality of commands to the memory device 200, and the memory device 200 can receive and return the memory data to the controller 100 in accordance with the commands.

The counters 402 can be designated for tracking information of the Nand pages 404. At least one of the counters 402 can be designated to each page or each block of the Nand pages 404, respectively. The counters 402 can be utilized for tracking and recording operations such as read, write, or erase operation of the Nand pages 404. Each of the counters 402 can be assigned to tracking one or more of the operations. The operation information tracked by the counters 402, such as numbers of the read, write, or erase operation can be saved and provided to the self-management component 408.

Optionally, the operation information tracked by the counters 402 can be synchronized with the memory controller 100 at certain time, such that when status of the Nand pages is changed or when the memory system is powered on. The status of the Nand pages can be changed when damaged Nand pages are identified and marked to prevent future read or write operation. The information of the damaged Nand pages can be tracked by the self-management component 408. Alternatively, the damaged Nand pages may be relocated to a designated area to consolidate the good/valid Nang pages consecutively available for write/read. The memory controller 100 may not need to update the logical addresses/physical addresses mapping, since the self-management component 408 can manage the health of the Nand pages 404. In some memory systems, information of the threshold voltages can be managed by the self-management component 408, and fed back to the manufactures.

The devoted memories 406 can be the memory spaces designated to record information for the self-management component 408 to make simple decisions or operations. The devoted memories 406 can record the information such as last written page address, previous read information including previous read address or read data. The information recorded in the devoted memories 406 can also include the number of PE cycle of the page blocks, the extensive read on particular page, the numbers of the counters 402, etc. The information recorded in the devoted memories 406 can be utilized as recovery information for rebuild processes after the interruption, such as power cycle or sudden power loss. The size and location of the devoted memories 406 can be configured in accordance with the configuration and the performance requirement of the memory system. The recovery information recorded by the devoted memories 406 can be provided to the self-management component 408. Optionally, the recovery information recorded by the devoted memories 406 can be synchronized to the memory controller 100.

The self-management component 408 can communicated with the devoted memories 406 and the counters 402, such as collecting the recovery information or operation information recorded in the devoted memories 406. The self-management component 408 can make relevant decisions, and perform simple operations, such as bookkeeping, tracking the number of PE cycles in the memory blocks, the address of the last written page in the block, the extensive read on particular page to prevent read disturb, etc., with the information collected from the counters 402 or the devoted memories 406. The self-management component 408 can be circuitry having functional blocks performing simple operations including reading, writing, calculating, tracking, erasing, or making simple decision, and sending some information to the memory controller 100 on the issues such as read disturb. The self-management component 408 can also be a simple CPU-like processor or AI. Since all the information requested for the simple decisions or simple operations are already recorded on the memory device 200, such as operation information or recovery information, the constantly updating between the memory controller 100 and the memory devices 200 can be avoid and the communication there between can be substantially reduced. Thus, the memory system can operate faster and more accurate resulting in improvements of the performance and reliability.

By tracking and recording the recovery information in the devoted memories 406 in the memory device 200 instead of being transferred from the memory controller 100, the constantly updating from the memory controller 100 for the recovery information may be reduced. The recovery data recorded in the devoted memories 406 can be the most updated real time data. The data recovery process can be faster because of the elimination of the updating time from the memory controller 100, and more accurate because the recovery data is the most updated. The memory device 200 can be self-managed for the recovery operations after the events like the sudden power loss since the recovery data are already recorded in the memory device 200 before power loss, the memory controller 100 may not even need to be involved.

The PE information recorded in the devoted memories 406 can be utilized by the self-management component 408 to balance reading/writing operations for evenly distributing to all the Nand pages or blocks. The evenly distributed Nand pages or blocks may prevent Nand pages being damaged due to substantially imbalanced read/write to certain Nand pages, and can prolong the life of the memory system.

It has been discovered that, a self-managed Nand can unload the burden of a memory controller by relocating simple operations and simple decisions from the memory controller to the self-managed Nand. Therefore, the memory controller only needs to request necessary information from the memory devices, such as Nand, to perform macro management on the Nand. The macro management can control more important and complicated upper level tasks like garbage collection, wear-leverage, and end of life handling, while the self-managed Nand can perform micro management of separated operations described above. The separation of the operations performed by the memory controller and the self-managed Nand can optimize the performance of the memory system and maximize the utilization of the bandwidth and memory spaces, by reducing the communication between the memory controller and the self-managed Nand. The self-managed Nand memory system can provide more accurate real time information for more prompt operations, resulting in faster and more reliable memory system with reduced power consumption.

Figure 5:
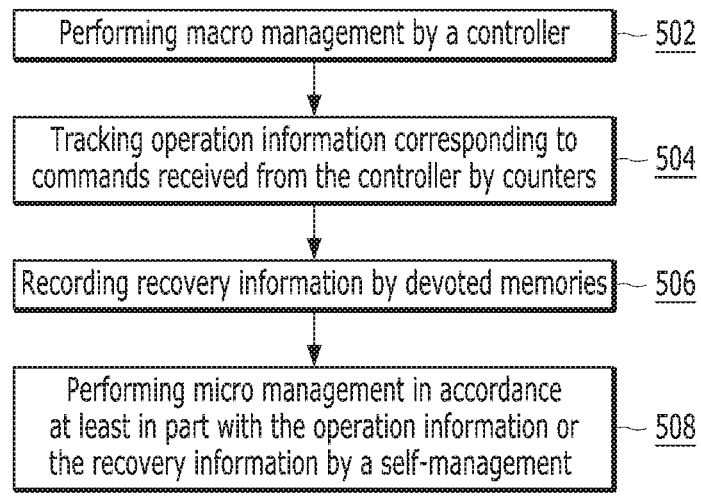
FIG. 5 is a flowchart illustrating an operating method of a semiconductor memory system in a further embodiment of the present invention.

FIG. 5 is a flowchart illustrating an operating method of a semiconductor memory system in a further embodiment of the present invention. The flowchart of operating method of a semiconductor memory system comprising: performing macro management by a controller in a block of 502; tracking operation information corresponding to Nand pages in accordance with commands received from the controller by counters in a block of 504; recording recovery information by devoted memories in a block of 506; and performing micro management in accordance at least in part with the operation information or the recovery information by a self-management component in a block of 508.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A semiconductor memory system comprising:
   a memory device including a plurality of blocks, counters, a self-management component, and devoted memories, and
   a memory controller configured to control the memory device;
   wherein each of the plurality of blocks includes pages, the pages are configured to store data corresponding to commands received from the memory controller,
   wherein the counters are configured to track operation information corresponding to the blocks,
   wherein the devoted memories are configured to record recovery information corresponding to the commands,
   wherein the self-management component is configured to perform micro management level operations based on the operation information and the recovery information, the micro management level operations comprise tracking program/erase cycles of the blocks and extensive reads on the blocks.

2. The semiconductor memory system recited in claim 1, wherein the self-management component includes a simple CPU-like processor.

3. The semiconductor memory system recited in claim 1, wherein the self-management component includes artificial intelligent.

4. The semiconductor memory system recited in claim 1, wherein the counters comprise a plurality of counters, each of the plurality of counters is designated to at least a page of the blocks or a block of the blocks.

5. The semiconductor memory system recited in claim 1, wherein the operation information comprises the number of read operation, the number of write operation, the number of erase operation, or a combination thereof.

6. The semiconductor memory system recited in claim 1, wherein the devoted memories are configured with various sizes and locations.

7. The semiconductor memory system recited in claim 1, wherein the devoted memories are configured with at least one of the blocks.

8. The semiconductor memory system recited in claim 1, wherein the recovery information comprises last written page addresses of the commands, read addresses of the pages corresponding to the commands previously, read data among the stored data in the pages corresponding to the commands previously, extensive reads on a particular page of a particular block or a combination thereof.

9. The semiconductor memory system recited in claim 1, wherein the micro management level operations comprise bookkeeping, tracking numbers of program/erase cycles, tracking addresses of last written pages, tracking extensive read on particular pages to prevent read disturb, tracking damaged pages, or a combination thereof.

10. The semiconductor memory system recited in claim 1, wherein the memory controller performs upper level tasks to control the memory device, the upper level tasks include garbage collection of the memory device, wear-leverage of the memory device, end of life handling of the memory device or a combination thereof.

11. The semiconductor memory system recited in claim 1, wherein the memory device provides the operation information or the recovery information to the memory controller.

12. The semiconductor memory system recited in claim 1, wherein the self-management component is configured to perform micro management level operations without the commands received from the memory controller.

13. A storage system comprising:
   a plurality of blocks including pages;
   a self-management component configured to perform micro management level operations to control each of the plurality of blocks, and
   a controller configured to perform macro management level tasks to control the plurality of blocks as a whole;
   wherein the pages are configured to store data corresponding to commands received from the controller,
   wherein the self-management component is configured to perform micro management level operations based on operation information of the each of plurality of blocks and recovery information of the each of plurality of blocks, the micro management level operations comprise tracking program/erase cycles of the blocks and extensive reads on the blocks, and
   wherein the macro management level tasks include garbage collection of the plurality of blocks, wear-leverage of the plurality of blocks, end of life handling of the plurality of blocks or a combination thereof.

14. The storage system recited in claim 13, further comprising a devoted memories configured to store the recovery information.

15. The storage system recited in claim 14, further comprising a counters configured to store the operation information.

16. The storage system recited in claim 14, wherein the devoted memories are configured with at least one of the blocks.

17. The storage system recited in claim 15, wherein the counters comprise a plurality of counters, each of the plurality of counters is designated to at least a page of pages or a block of the blocks.

18. The storage system recited in claim 13, wherein the operation information comprises the number of read operation, the number of write operation, the number of erase operation, or a combination thereof.

19. The storage system recited in claim 13, wherein the recovery information comprises last written page addresses of the commands, read addresses of the pages corresponding to the commands previously, read data among the stored data in the pages corresponding to the commands previously, extensive reads on a particular page of a particular block or a combination thereof.

20. The storage system recited in claim 13, wherein the micro management level operations comprise bookkeeping, tracking numbers of program/erase cycles, tracking addresses of last written pages, tracking extensive read on particular pages to prevent read disturb, tracking damaged pages, or a combination thereof.

* * * * *